United States Patent
Effting et al.

(10) Patent No.: US 12,306,121 B2
(45) Date of Patent: May 20, 2025

(54) METHOD AND APPARATUS FOR INSPECTING A SAMPLE BY MEANS OF MULTIPLE CHARGED PARTICLE BEAMLETS

(71) Applicant: DELMIC IP B.V., Delft (NL)

(72) Inventors: Andries Pieter Johan Effting, Delft (NL); Sander Vincent Den Hoedt, Delft (NL)

(73) Assignee: DELMIC IP B.V., Delft (NL)

( * ) Notice: Subject to any disclaimer, the term of this patent is extended or adjusted under 35 U.S.C. 154(b) by 540 days.

(21) Appl. No.: 17/790,996

(22) PCT Filed: Jan. 5, 2021

(86) PCT No.: PCT/NL2021/050001
§ 371 (c)(1),
(2) Date: Jul. 6, 2022

(87) PCT Pub. No.: WO2021/141488
PCT Pub. Date: Jul. 15, 2021

(65) Prior Publication Data
US 2023/0020967 A1    Jan. 19, 2023

(30) Foreign Application Priority Data
Jan. 6, 2020    (NL) .................................... 2024606

(51) Int. Cl.
*H01J 37/26*    (2006.01)
*G01N 23/2252*    (2018.01)
*H01J 37/28*    (2006.01)

(52) U.S. Cl.
CPC ........ *G01N 23/2252* (2013.01); *H01J 37/263* (2013.01); *H01J 37/28* (2013.01);
(Continued)

(58) Field of Classification Search
CPC .. H01J 37/263; H01J 37/28; H01J 2237/2807; H01J 2237/2808; G01N 23/2252
See application file for complete search history.

(56) References Cited

U.S. PATENT DOCUMENTS

| | | | |
|---|---|---|---|
| 9,564,291 B1 | 2/2017 | Own et al. | |
| 10,504,683 B2 * | 12/2019 | Frosien | .................. H01J 37/09 |

(Continued)

FOREIGN PATENT DOCUMENTS

| | | |
|---|---|---|
| WO | 2013191539 A1 | 12/2013 |
| WO | 2014065663 A1 | 5/2014 |

(Continued)

OTHER PUBLICATIONS

Chinese Office Action from Corresponding Chinese Patent Application No. CN202180008000.4, Jan. 2, 2025.

(Continued)

*Primary Examiner* — Sean M Luck
(74) *Attorney, Agent, or Firm* — Workman Nydegger

(57) ABSTRACT

A method for inspecting a sample by means of a multi-beam charged particle inspection apparatus, and an apparatus for performing this method are provided. The multi-beam charged particle inspection apparatus is configured to project an array of charged particle beamlets within an exposure area on the sample. The apparatus includes a detection system for detecting X-Rays and/or cathodoluminescent light from the exposure area emitted by the sample due to an interaction of the array of charged particle beamlets with the sample. The method includes the steps of projecting the array of charged particle beamlets within the exposure area on the sample, and monitoring a combined emission of X-Rays and/or cathodoluminescent light from the interaction of substantially all charged particle beamlets of the array of charged particle beamlets with the sample.

11 Claims, 1 Drawing Sheet

(52) U.S. Cl.
CPC .............. *H01J 2237/2807* (2013.01); *H01J 2237/2808* (2013.01)

(56) References Cited

U.S. PATENT DOCUMENTS

| | | |
|---|---|---|
| 2008/0061234 A1 | 3/2008 | Nakamura |
| 2012/0241606 A1 | 9/2012 | Han et al. |
| 2019/0043691 A1* | 2/2019 | Zhang .................. H01J 37/265 |

FOREIGN PATENT DOCUMENTS

| | | |
|---|---|---|
| WO | 2015170969 A1 | 11/2015 |
| WO | 2019048293 A1 | 3/2019 |

OTHER PUBLICATIONS

Search Report from corresponding Netherlands Application No. 2024606, Nov. 6, 2020.
International Search Report from PCT Application No. PCT/NL2021/050001, Mar. 16, 2021.

\* cited by examiner

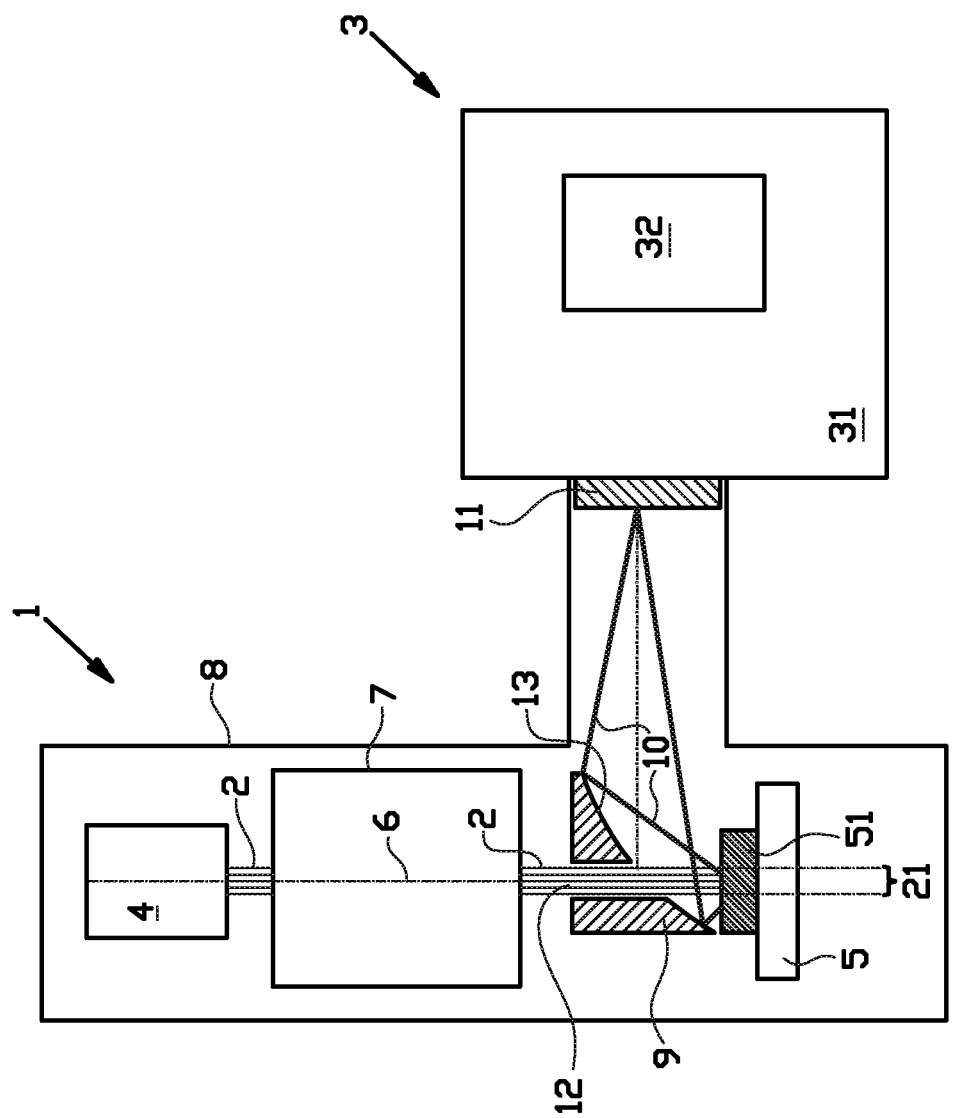

METHOD AND APPARATUS FOR INSPECTING A SAMPLE BY MEANS OF MULTIPLE CHARGED PARTICLE BEAMLETS

BACKGROUND

The invention relates to a method of inspecting a sample by means of a multi-beam charged particle inspection apparatus. In addition, the invention relates to a multi-beam charged particle inspection apparatus adapted to perform the method.

Examples of a multi-beam charged particle inspection device are for example described in WO2013/191539, WO2014/065663, WO2015/170969 and WO2019/048293. These International Patent Application publications disclose apparatuses for inspecting a surface of a sample. Such an apparatus comprises at least one charged particle source for generating a diverging charged particle beam. The diverging charged particle beam is split into an array of charged particle beams by an aperture array, which array of charged particle beams are directed towards a sample. The array of charged particle beams is focused into an array of individual spots on the sample surface by means of a lens system.

These publications further describe different detection arrangements for individually detecting a signal from each one of said individual spots on the sample surface as created by the interaction of each individual charged particle beam of the array of charged particle beams with the sample, such as secondary electrons, back-scattered electrons and transmitted electrons. Each of these detection arrangements tries to allocate the location of origin of each individual signal from each individual charged particle beam of said array of charged particle beams. By scanning the array of charged particle beams over the sample area and detecting the signal originating from each charged particle beam of said array of charged particle beams, an image of the sample can be acquired by combining the measurements from all charged particle beams of said array of charged particle beam. By using multiple charged particle beams, the acquisition of an image is accelerated considerably when compared with a single beam charged particle inspection device. However, the analysis of high-resolution images obtained by a multi-beam charged particle inspection device is substantially the same as the analysis of a high-resolution image as obtained with a single beam charged particle inspection device.

SUMMARY OF THE INVENTION

A disadvantage of the known devices and methods for inspecting a sample is that these are configured to acquire high-resolution images of a sample, which is not always necessary to establish whether or not the sample comprises one or more defects.

It is an object of the present invention to provide a more efficient method and apparatus to establish whether or not the sample comprises one or more defects, and/or to provide an alternative method for inspecting a sample by means of a multi-beam charged particle inspection apparatus.

According to a first aspect, the present invention provides a method of inspecting a sample by means of a multi-beam charged particle inspection apparatus, wherein the multi-beam charged particle inspection apparatus is configured to project an array of charged particle beamlets within an exposure area on said sample, wherein the multi-beam charged particle inspection apparatus comprises a detection system for detecting X-Rays and/or cathodoluminescent light from said exposure area emitted by the sample due to an interaction of the array of charged particle beamlets with the sample, wherein the method comprises the steps of:
projecting the array of charged particle beamlets within the exposure area on said sample, and
monitoring a combined emission of X-Rays and/or cathodoluminescent light from the interaction of substantially all charged particle beamlets of said array of charged particle beamlets with the sample.

The method of the present invention is based on two insights of the inventor:

Firstly, during an interaction between charged particles and a sample, in addition to the customary backscattered, secondary and/or transmitted charged particles, other emissions are generated. The most notable ones are X-Rays and cathodoluminescent light. The specific wavelength(s) and/or intensity of the emitted X-Rays and/or cathodoluminescent light may provide additional information about the specific interaction between the charged particles and the sample. For example, when the emitted X-Rays and/or cathodoluminescent light from an interaction between a charged particle and a position in the sample comprising a defect is different in wavelength and/or intensity from the emitted X-Rays and/or cathodoluminescent light from an interaction between a charged particle and a position in the sample without a defect, it can be established from the emission of X-Rays and/or cathodoluminescent light from the interaction of a charged particle beamlet of said array of charged particle beamlets with the sample, whether or not said charged particle beamlet of the array of charged particle beamlets interacts with a defect in the sample.

Secondly, to establish whether or not the sample comprises one or more defects, it is not so important to precisely allocate the position of these defects.

Accordingly, instead of using a detection arrangement that allocates the location of origin of each individual signal from each individual charged particle beam of said array of charged particle beamlets as in the prior art, the method of the present invention utilizes the combined emission of X-Rays and/or cathodoluminescent light from the interaction of substantially all charged particle beamlets of said array of charged particle beamlets with the sample, to establish whether or not one of the charged particle beamlets of the array of charged particle beamlets interacts with a defect in the sample. By monitoring the combined emission of X-Rays and/or cathodoluminescent light from the interaction of substantially all charged particle beamlets of said array of charged particle beamlets with the sample, a single measurement of said combined emission can reveal whether or not there is a defect within the exposure area. Accordingly, the present invention provides a method which can quickly establish from a measurement of the combined emission, whether or not a defect is present in the exposure area.

It is noted that WO2019/048293 discloses an apparatus for inspecting samples with multiple beams of charged particles. In an example, multiple beams of charged particles can simultaneously scan multiple regions on a sample. The multiple regions may have overlaps among them, may be tiled to cover a continuous area, or may be isolated from one another. Signals generated from the interactions of the beams and the sample may be collected by multiple detectors. The number of detectors may be less than, equal to, or greater than the number of the beams. However, there is neither a hint, nor a suggestion in WO2019/048293 that two or more of the multiple beams of charged particles overlap on the sample, and/or that the signals generated from the interactions of two or more beams and the sample may be combined collected on a single detector.

It is further noted that US2008/0061234 discloses an apparatus for inspecting samples using a single electron beam. According, there is neither a hint, nor a suggestion in US2008/0061234 that the signals generated from the interactions of two or more beams and the sample may be combined collected on a single detector.

It is noted that the method of the present invention is not limited to the detection of defects. The method of the present invention allows to find any feature in the sample that has a specific emission of X-Rays and/or cathodoluminescent light that differs from the emission of X-Rays and/or cathodoluminescent light from parts of the sample without said feature.

It is further noted that the use of an array of charged particle beamlets as in the present inventions, allows to probe the exposure area with multiple beamlets having substantially the same intensity. For example, an array of charged particle beamlets can be generated in which the difference between the current in a central beamlet and a beamlet at the edge of the array is within 5% of an average current. Accordingly, the sensitivity to detect a specific feature is for each beamlet of the array of beamlets substantially the same.

This in contrast to a single charged particle beam which has been defocused to cover the exposure area, which single beam usually has a Gauss type intensity distribution having a high intensity in the center and a low intensity at the edge of the exposure area. Accordingly, a disadvantage of using a defocused single charged particle beam is, that the sensitivity to detect a specific feature strongly varies as a function of the distance to the center of the beam.

In an embodiment, the multi-beam charged inspection apparatus is arranged to detect an intensity of the combined emission, a spectrum of the combined emission, and/or a lifetime of excited species which emit said X-Rays and/or cathodoluminescent light in the combined emission, and wherein the method comprises the step of:

monitoring at least one of the intensity, spectrum and lifetime of excited species of the combined emission.

It is noted that X-Ray detectors, in particularly Energy Dispersive X-Ray detectors, and cathodoluminescent light detectors, in particular when combined in a spectrometer, can distinguish between photons having different energy or wavelength. Accordingly, the presence of a feature that emits photons with a specific energy or wavelength when irradiated by a charged particle beamlet, which specific energy or wavelength is distinguishable from the emission from the parts of the sample without said feature, can easily be established by selecting the appropriate energy or wavelengths of the photons to be detected by the detector, or by detecting at least part of a spectrum comprising said specific energy of wavelength.

In addition or alternatively, the X-Rays and/or cathodoluminescent light is emitted from atoms or molecules in the sample after excitation by a charged particle from one of said charged particle beamlets. Short after the atoms or molecules are promoted to an excited state, this system can return to a state with lower energy by emitting an X-Ray photon or a cathodoluminescent photon. The time difference between the excitation to an elevated energy level and the return to a state with lower energy is dependent on the lifetime of the excited species. Accordingly, the presence of a feature of which excited species have a specific lifetime, which specific lifetime is distinguishable from the lifetime of excited species from the parts of the sample without said feature, can easily be established by selecting the appropriate time delay between the irradiation of the sample with the charged particles and the detection of the X-Ray and/or cathodoluminescent photons by the detector, or by detecting the intensity of the X-Rays and/or cathodoluminescent light as a function of time after irradiation of the sample with a pulse of charged particles. Alternatively, the lifetime of the excited species can also be obtained using a Hanbury Twiss Brown spectrometer to measure an autocorrelation between the irradiation by the charged particles and the emission of X-Ray photons and/or cathodoluminescent photons.

In an embodiment, the combined emission is detected at a predetermined photon energy and/or wavelength. The predetermined photon energy and/or wavelength can, for example, be selected by using appropriate filtering devices and/or energy dispersive devices which are well known in the art. Preferably, the predetermined photon energy and/or wavelength is selected to a photon energy and/or wavelength at which an emission of the to be detected feature emits is distinguishable from an emission of a part of the sample without said to be detected feature.

In an embodiment, the method further comprises the steps of scanning the array of charged particle beamlets over the sample along a scan path, and monitoring said combined emission during said scanning as a function of the position along said scan path. Accordingly, this embodiment allows to establish whether or not the sample comprises one or more specific detectable features in said scan path. In an embodiment, the scan path can be configured to at least substantially cover the complete surface of the sample in order to establish whether or not a specific feature which is distinguishable by the emission of X-Rays and/or cathodoluminescent light is present in the sample.

In an embodiment, the method comprises the steps of comparing detected combined emission with a predetermined threshold value, and registering a position of the exposure area where the combined emission exceeds said predetermined threshold value. Accordingly, by selecting an appropriate threshold value the monitoring of whether or not a specific feature which is distinguishable by the emission of X-Rays and/or cathodoluminescent light is present in the sample can be automated which allows automatic scanning of samples.

In an embodiment, the exposure area at said position is inspected using a single charged particle beam, wherein the method comprises the steps of projecting the single charged particle beam on said sample and scanning the single charged particle beam over the exposure area at said position, and monitoring the emission of X-Rays and/or cathodoluminescent light during said scanning of said single charged particle beam as a function of the position within said exposure area. In case that a more accurate determination of the position of a specific feature which is distinguishable by the emission of X-Rays and/or cathodoluminescent light, is necessary, the exposure area within which the emission by the specific feature was detected in the combined emission, is scanned by a single charged particle beam in order to more accurately establish at which position the specific feature is located. An advantage of using a single charged particle beam is that the same detector system can be used for this single charged particle beam scan for detecting the emission of the specific feature.

Preferably, the single charged particle beam used for this single beam inspection of the exposure area is one of the charged particle beamlet from the array of charged particle beamlets. By using one charged particle beamlet from the array of charged particle beamlets for the single beam inspection of the exposure area, the emission of X-Rays and/or cathodoluminescent light when the single charged particle beamlet irradiates the specific feature will provide a substantially same response as when one of the charged particle beamlets of the array of charged particle beamlets irradiates the specific feature during the inspection of the sample using the array of charged particle beamlets. This allows to more easily compare the multi-beam inspection with the single beam inspection.

In addition or alternatively to scanning a single charged particle beam over the exposure area, it is also possible to use the array of charged particle beamlets and to allow only one charged particle beamlet of said array of beamlets to impinge on the sample, and to successively change over from said one charged particle beamlet to another one charged particle beamlet of the array of charged particle beamlet, in particular until all charged particle beamlets of said array of charged particle beamlets have solitary (one after the other) irradiated the exposure area.

According to a second aspect, the present invention provides a multi-beam charged particle inspection apparatus, wherein the multi-beam charged particle inspection apparatus is configured to project an array of charged particle beamlets within an exposure area on a sample, wherein the multi-beam charged particle inspection apparatus comprises a detection system which is configured for detecting a combined emission of X-Rays and/or cathodoluminescent light from substantially all charged particle beamlets of said array of charged particle beamlets from said exposure area and emitted by the sample due to an interaction of the charged particle beamlets of said array of charged particle beamlets with the sample, wherein the multi-beam charged particle inspection apparatus comprises a controller which is configured to control the working of said inspection apparatus to perform the method or an embodiment thereof as described above.

In an embodiment, the multi-beam charged particle inspection apparatus further comprises a scanning assembly for scanning the array of charged particle beamlets over the sample along a scan path, and a data processing system adapted to construct a low resolution image from the monitoring of the combined emission of X-Rays and/or cathodoluminescent light from said exposure area during said scanning of said array of charged particle beamlets as a function of the position along said scan path. In addition or alternatively, the data processing system is adapted to construct a high resolution image from the monitoring of the emission of X-Rays and/or cathodoluminescent photons during said scanning of said single charged particle beam as a function of the position within said exposure area.

In an embodiment, the detection system comprises a spectrometer which is configured to obtain at least part of a spectrum from the combined emission.

According to a third aspect, the invention provides a computer program having instructions which are adapted, when loaded on a controller of a multi-beam charged particle inspection apparatus, to perform the method or an embodiment thereof as described above.

According to a fourth aspect, the invention provides a computer readable medium, having a computer program as described above, recorded thereon.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which:

FIG. 1 schematically shows a side view of an example of a multi-beam charged particle inspection apparatus according to the present invention.

DETAILED DESCRIPTION OF THE INVENTION

FIG. 1 shows a schematic side view of an example of a multi-beam charged particle inspection apparatus according to the present invention and/or for performing the method of the present invention.

The multi-beam charged particle inspection apparatus 1 comprises a charged particle beam source 4 which is configure for generating an array of charged particle beamlets 2, and a sample holder 5 for holding a sample in a sample position. The multi-beam charged particle inspection apparatus 1 comprises a central axis 6 and is configured for projecting the array of charged particle beamlets 2 along said central axis 6 from the charged particle beam source 4 towards a sample 51 on the sample holder 5. The multi-beam charged particle inspection apparatus 1 further comprises charged particle optics 7 for, in use, projecting and focusing the charged particle beamlets within an exposure area 21 on the sample on the sample holder 5.

Furthermore, the multi-beam charged particle inspection apparatus 1 comprises a detection system which is configured for detecting a combined emission of X-Rays and/or cathodoluminescent light from substantially all charged particle beamlets 2 of said array of charged particle beamlets from said exposure area 21 and emitted by the sample 51 due to an interaction of the charged particle beamlets 2 of said array of charged particle beamlets with the sample 51.

In particular, the detection system comprises a mirror 9 which is configured to receive X-Rays and/or cathodoluminescent light 10 from the exposure area 21, and to direct said X-Rays and/or cathodoluminescent light towards a detector 3. The mirror 9 is arranged between the charged particle beam source 4 and the sample holder 5, and is configured such that the central axis 6 passes through an aperture 12 of the mirror 9. In use, the array of charged particle beamlets 2 is directed through said aperture 12 onto the exposure area 21 on the surface of the sample 51 facing a reflecting side 13 of the mirror 9. The mirror 9 is configured to collect X-Rays and/or cathodoluminescent light coming from the interaction of substantially all charged particle beamlets of said array of charged particle beamlets 2 with the sample 51, and to project these X-Rays and/or this cathodoluminescent light onto a detector 3. Accordingly, the detector 3 is configured to detect X-Rays and/or cathodoluminescent light from substantially the whole exposure area 21. By monitoring the combined emission of X-Rays and/or cathodoluminescent light from the interaction of substantially all charged particle beamlets of said array of charged particle beamlets 2 with the sample 51 by means of the detector 3, a single measurement of said combined emission can reveal whether or not one of the charged particle beamlets 2 impinges onto a specific feature which is distinguishable by the emission of X-Rays and/or cathodoluminescent light, such as a defect in the sample 51.

In this preferred embodiment, the charged particle optics 7 and/or the sample holder 5 comprises a scanning device which is configured for moving the sample 51 and the array of charged particle beamlets 2 with respect to each other, which allows to scan the array of charged particle beamlets 2 over the whole area of the exposure area in order to search for the presence of the specific feature within said exposure area. In addition, the scanning device may also allow to move the scan area 21 over the surface of the sample 51, which allows to scan over the whole area of the sample 51 in order to search of the presence of the specific feature.

Scanning devices as such are known in the art. For example, the charged particle optics 7 may comprise a magnetic and/or electrostatic deflector for deflecting the array of charged particles 2 in a direction substantially perpendicular to the central axis 6. In addition or alternatively, the sample holder 5 may comprise one or more translation stages for moving the sample 51 in one or more directions substantially perpendicular to the central axis 6.

The detection device 3 can be provided with a filtering device 11 which is configured to filter the combined emission 10 to allow photons with a predetermined photon energy and/or wavelength to pass the filtering device 11. Due to the filtering device 11, the detection device 11 is arranged to detect only the part of the combined emission at a predetermined photon energy and/or wavelength. Preferably, the predetermined photon energy and/or wavelength of the filtering device 11 is selected to allow the detection device 3 to detect X-Rays and/or cathodoluminescent light with a photon energy and/or wavelength at which an emission of the to be detected feature is distinguishable from an emission of a part of the sample without said to be detected feature.

In addition or alternatively, the detection device 3 comprises an energy dispersive device 31, such as a spectrometer, which is configured to disperse the X-Rays and/or the cathodoluminescent light of the combined emission 10 over an internal detector 32 in order to obtain a spectrum or a part of a spectrum of the combined emission 10. Preferably, the energy dispersive device 31 is configured to allow the detector 32 to detect X-Rays and/or cathodoluminescent light with a photon energy and/or wavelength at which an emission of the to be detected feature is distinguishable from an emission of a part of the sample without said to be detected feature.

In addition or alternatively, the detection device 3 comprises a Hanbury Twiss Brown spectrometer, also known as intensity interferometers to measure a correlation effect between the impinging charged particles and the emitted X-Ray photons and/or cathodoluminescent photons, which allows to determine a measure for the lifetime of the exited species which emit said X-Ray photons and/or cathodoluminescent photons.

It is noted that in this example the charged particle inspection apparatus 1 comprises one detection device 3 which may be optimized for detecting X-Rays or cathodoluminescent light using an intensity detector, or an intensity detector combined with a filtering device 11 or an energy dispersive device 31, or a Hanbury Twiss Brown spectrometer. However, the charged particle inspection apparatus of the present invention may also comprise a combination of these different detection devices.

The multi-beam charged particle inspection apparatus 1 comprises a housing 8, preferably a vacuum chamber which allows operating the multiple charged particle beamlets 2 in vacuum condition. An example of such a charged particle analytical apparatus is a multi-beam electron microscope, in particular a scanning multi-beam electron microscope (multi-beam SEM).

In addition or alternatively, the charged particle beam source 4 is configured to provide an array of charged particle beamlets 2 of which the intensity of the charged particle beamlets 2 varies in time. The intensity of the charged particle beamlets 2 may vary periodically or the charged particle beam source 4 may be configured to provide pulses of charged particles. Furthermore, the detection device 3 of this exemplary embodiment is configured to detect X-Rays and/or cathodoluminescent light in a time resolved manner. This arrangement allows to detect a time difference between the excitation of the sample by the array of charged particle beamlets 2 and the emission of X-Rays and/or cathodoluminescent light, and thus a lifetime of the excited species which emit the X-Rays and/or cathodoluminescent light. Accordingly, this exemplary embodiment allows to detect the presence of a specific feature comprising excited species have a specific lifetime, which specific lifetime is distinguishable from the lifetime of excited species from the parts of the sample 51 without said feature. By selecting the appropriate time delay or phase shift between the irradiation of the sample 51 with the charged particle beamlets 2 and the detection of the X-Ray and/or cathodoluminescent photons by the detection device 3, or by detecting the intensity of the X-Rays and/or cathodoluminescent light as a function of time after irradiation of the sample with charged particle beamlets with an intensity which varies in time, it can be established whether or not the specific feature is present in the part of the sample 51 that is irradiated by the charged particle beamlets 2.

In addition or alternatively, the charged particle beam source 4 and/or the charged particle optics 7 is configured to switch between a multi-beam mode and a single beam mode. In the multi-beam mode, all charged particle beams of the array of charged particle beams 2 are directed to the sample 51. Whereas in the single beam mode, only one charged particle beam of the array of charged particle beams 2 is directed to the sample 51. This exemplary embodiment allows to inspect the exposure area using a single charged particle beam, by projecting the single charged particle beam on said sample 51 and scanning the single charged particle beam over the exposure area 21 at said position, and monitoring the emission of X-Rays and/or cathodoluminescent light 10 during said scanning of said single charged particle beam as a function of the position within said exposure area 21. This allows a more accurate determination of the position of a specific feature which is distinguishable by the emission of X-Rays and/or cathodoluminescent light within the exposure area within which the emission by the specific feature was detected in the combined emission. An advantage of the charged particle beam source 4 and/or the charged particle optics 7 which is configured to switch between a multi-beam mode and a single beam mode is that the same detector system 3 can be used for both the detection of the combined emission and the detection of any emission from this single charged particle beam scan for detecting the emission of the specific feature.

It is noted that the above exemplary embodiments of a multi-beam charged particle inspection apparatus are in particular suited to perform the method as described above, or an embodiment thereof. This method in particular comprises the steps of:

projecting the array of charged particle beamlets 2 within the exposure area 21 on said sample 51, and monitoring a combined emission of X-Rays and/or cathodoluminescent light 10 from the interaction of substantially all charged particle beamlets of said array of charged particle beamlets 2 with the sample 51, preferably by means of the detection device 3.

In summary, the present invention relates to a method of inspecting a sample by means of a multi-beam charged particle inspection apparatus, and an apparatus for performing this method. The multi-beam charged particle inspection apparatus is configured to project an array of charged particle beamlets within an exposure area on said sample. Said apparatus comprises a detection system for detecting X-Rays and/or cathodoluminescent light from said exposure area emitted by the sample due to an interaction of the array of charged particle beamlets with the sample. The method comprises the steps of:

projecting the array of charged particle beamlets within the exposure area on said sample, and monitoring a combined emission of X-Rays and/or cathodoluminescent light from the interaction of substantially all charged particle beamlets of said array of charged particle beamlets with the sample.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

The invention claimed is:

1. A method of inspecting a sample by means of a multi-beam charged particle inspection apparatus,
wherein the multi-beam charged particle inspection apparatus is configured to project an array of charged particle beamlets within an exposure area on said sample,
wherein the multi-beam charged particle inspection apparatus comprises a detection system for detecting X-Rays and/or cathodoluminescent light from said exposure area emitted by the sample due to an interaction of the array of charged particle beamlets with the sample,
the method comprising the steps of:
projecting the array of charged particle beamlets within the exposure area on said sample, and
monitoring a combined emission of X-Rays and/or cathodoluminescent light from the interaction of substantially all charged particle beamlets of said array of charged particle beamlets with the sample.

2. The method according to claim 1, wherein the multi-beam charged inspection apparatus is arranged to detect an intensity of the combined emission, a spectrum of the combined emission, and/or a lifetime of excited species which emit said X-Rays and/or cathodoluminescent light in the combined emission, and
wherein the method further comprises the step of:
monitoring at least one of the intensity, spectrum and lifetime of excited species of the combined emission.

3. The method according to claim 1, further comprising the steps of:
scanning the array of charged particle beamlets over the sample along a scan path, and
monitoring said combined emission during said scanning as a function of the position along said scan path.

4. The method according to claim 1, wherein the method comprises the steps of:
comparing detected combined emission with a predetermined threshold value, and
registering a position of the exposure area where the combined emission exceeds said predetermined threshold value.

5. The method according to claim 4, wherein the combined emission is detected at a predetermined photon energy and/or wavelength.

6. The method according to claim 4, wherein the exposure area at said position is inspected using a single charged particle beam,
wherein the method further comprises the steps of:
projecting the single charged particle beam on said sample and scanning the single charged particle beam over the exposure area at said position, and
monitoring the emission of X-Rays and/or cathodoluminescent light during said scanning of said single charged particle beam as a function of the position within said exposure area.

7. A multi-beam charged particle inspection apparatus, wherein the multi-beam charged particle inspection apparatus is configured to project an array of charged particle beamlets within an exposure area on a sample,
wherein the multi-beam charged particle inspection apparatus comprises
a detection system which is configured for detecting a combined emission of X-Rays and/or cathodoluminescent light from substantially all charged particle beamlets of said array of charged particle beamlets from said exposure area and emitted by the sample due to an interaction of the charged particle beamlets of said array of charged particle beamlets with the sample,
wherein the multi-beam charged particle inspection apparatus comprises a controller which is configured to control the working of said inspection apparatus to perform a method according to claim 1.

8. The multi-beam charged particle inspection apparatus according to claim 7, further comprising:
scanning assembly for scanning the array of charged particle beamlets over the sample along a scan path, and
a data processing system adapted to construct a low resolution image from the monitoring of the combined emission of X-Rays and/or cathodoluminescent light from said exposure area during said scanning of said array of charged particle beamlets as a function of the position along said scan path, and/or adapted to construct a high resolution image from the monitoring the emission of X-Rays and/or cathodoluminescent photons during said scanning of said single charged particle beam as a function of the position within said exposure area.

9. The multi-beam charged particle inspection apparatus according to claim 7, wherein the detection system comprises a spectrometer which is configured to obtain at least part of a spectrum from the combined emission.

10. A computer program having instructions which are adapted, when loaded on a controller of a multi-beam charged particle inspection apparatus, to perform the method according to claim 1.

11. A computer readable medium, having a computer program according to claim 10 recorded thereon.

* * * * *